(12) United States Patent
Yoo et al.

(10) Patent No.: US 10,770,639 B2
(45) Date of Patent: Sep. 8, 2020

(54) METHOD OF FORMING SUPERCONDUCTING WIRE

(71) Applicant: Seoul National University R&DB Foundation, Seoul (KR)

(72) Inventors: Sang-Im Yoo, Seoul (KR); Insung Park, Seoul (KR)

(73) Assignee: SEOUL NATIONAL UNIVERSITY R & DB FOUNDATION, Seoul (KR)

( * ) Notice: Subject to any disclaimer, the term of this patent is extended or adjusted under 35 U.S.C. 154(b) by 17 days.

(21) Appl. No.: 16/196,125

(22) Filed: Nov. 20, 2018

(65) Prior Publication Data
US 2019/0157540 A1    May 23, 2019

(30) Foreign Application Priority Data

Nov. 20, 2017 (KR) .................. 10-2017-0155142
Feb. 9, 2018 (KR) .................. 10-2018-0016480

(51) Int. Cl.
| | | |
|---|---|---|
| *H01L 39/24* | (2006.01) | |
| *C30B 33/02* | (2006.01) | |
| *C30B 29/22* | (2006.01) | |
| *C30B 11/00* | (2006.01) | |

(52) U.S. Cl.
CPC .......... *H01L 39/2451* (2013.01); *C30B 11/00* (2013.01); *C30B 29/22* (2013.01); *C30B 33/02* (2013.01); *H01L 39/2432* (2013.01); *H01L 39/2461* (2013.01); *H01L 39/2477* (2013.01)

(58) Field of Classification Search
CPC ..... H01L 39/2451; C30B 11/00; C30B 29/22; C30B 33/02
See application file for complete search history.

(56) References Cited

U.S. PATENT DOCUMENTS 5,418,215 A * 5/1995 Tauber ................ H01L 39/2458
428/688
2014/0342916 A1* 11/2014 Moon ................ H01L 39/2483
505/230

FOREIGN PATENT DOCUMENTS

KR       10-1719266 B1     4/2017

OTHER PUBLICATIONS

D. Dimos, et al., "Orientation Dependence of Grain-Boundary Critical Currents in YBa2Cu3O7-δ Bicrystals", vol. 61, No. 2, pp. 219-222, Jul. 11, 1998.

(Continued)

*Primary Examiner* — Paul A Wartalowicz
(74) *Attorney, Agent, or Firm* — Lee IP Law, P.C.

(57) ABSTRACT

Provided is a method of forming a superconducting wire, the method including forming a superconducting precursor film on a substrate, the super conducting precursor film containing Re, Ba, and Cu having a composition in which Ba is poor and Cu is rich compared to stoichiometric ReBCO ($Gd_1Ba_2Cu_3O_{7-y}$, $0 \leq y \leq 6$, Re: Rare earth element), heating the substrate to melt the superconducting precursor film, providing an oxygen gas having an oxygen partial pressure of about 10 mTorr to about 200 mTorr on the molten superconducting precursor film to form a superconducting layer including an epitaxial superconductor biaxially aligned only in the c-axis direction perpendicular to the substrate, and cooling the substrate.

7 Claims, 10 Drawing Sheets

(56) References Cited

OTHER PUBLICATIONS

Wei Zhang, et al., "Oxygen Pressure Dependence of Cu20-CuO-Gd20a Phase Diagram", Metallurgical Transactions B, vol. 22B, pp. 705-710, Oct. 1991.
Jae-Hun Lee, et al., "RCE-DR, a novel process for coated conductor fabrication with high performance", Superconductor Science and Technology, vol. 27, pp. 1-6, 2014.

* cited by examiner

| Oxygen partial pressure / Temperature | 150 mTorr | 100 mTorr | 50 mTorr | 20 mTorr | 10 mTorr |
|---|---|---|---|---|---|
| Upper limit temperature(°C) | 866±2 | 854±2 | 832±2 | 802±2 | 774±2 |
| Lower limit temperature(°C) | 848.5±2.5 | 831.5±2.5 | 809.5±2.5 | 789.5±2.5 | 774±2.5 |

METHOD OF FORMING SUPERCONDUCTING WIRE

CROSS-REFERENCE TO RELATED APPLICATIONS

This U.S. non-provisional patent application claims priority under 35 U.S.C. § 119 of Korean Patent Application No. 10-2017-0155142, filed on Nov. 20, 2017, and 10-2018-0016480, filed on Feb. 9, 2018, the entire contents of which are hereby incorporated by reference.

BACKGROUND

The present disclosure herein relates to a method of forming a superconducting wire.

A superconductor allows a flow of a large amount of current because the electrical resistance thereof becomes closer to zero at low temperatures. Recently, studies have been actively conducted on a thin buffer layer having a biaxially aligned textured structure or a second-generation high-temperature superconducting wire which forms a superconducting film on a metal substrate. The second-generation high-temperature superconducting wire has a current transport capacity per unit area which is significantly superior to that of a typical metal wire. The second-generation high-temperature superconducting wire can be used in fields such as a power field which has low power loss, an MRI, a superconducting magnetic levitation train, and a superconducting propulsion vessel.

SUMMARY

The present disclosure provides a method of forming a superconducting wire including a superconducting layer biaxially aligned only in a c-axis direction.

An embodiment of the inventive concept provides a method of forming a superconducting wire, the method including forming a superconducting precursor film on a substrate, the superconducting precursor film containing Re, Ba, and Cu having a composition in which Ba is poor and Cu is rich compared to stoichiometric ReBCO (Gd1Ba2Cu3O7-y, 0≤y≤0.65, Re: Rare earth element), heating the substrate to melt the superconducting precursor film, providing an oxygen gas having an oxygen partial pressure of about 10 mTorr to about 200 mTorr on the molten superconducting precursor film to form a superconducting layer including an epitaxial superconductor biaxially aligned only in the c-axis direction perpendicular to the substrate, and cooling the substrate.

In an embodiment, the Re may be Gd, and the superconducting precursor film may contain Gd, Ba, and Cu in a mixing ratio of 1:1:2.5.

In an embodiment, the substrate may be heated to a c-axis growth temperature determined according to the oxygen partial pressure, and the c-axis growth temperature may be about 774° C. to about 880° C.

In an embodiment, the c-axis growth temperature may include a lower limit temperature and an upper limit temperature, and when an oxygen partial pressure increases to about 20 mTorr to about 150 mTorr, the lower limit temperature may gradually increase from about 780° C. to about 848° C., and the upper limit temperature may gradually increase from about 800° C. to about 866° C.

In an embodiment, when the oxygen partial pressure is about 150 mTorr, the lower limit temperature may be about 850° C. and the upper limit temperature may be about 866° C.

In an embodiment, when the oxygen partial pressure is about 100 mTorr, the lower limit temperature may be about 832° C. and the upper limit temperature may be about 850° C.

In an embodiment, when the oxygen partial pressure is about 50 mTorr, the lower limit temperature may be about 810° C. and the upper limit temperature may be about 830° C.

In an embodiment, when the oxygen partial pressure is about 20 mTorr, the lower limit temperature may be about 790° C. and the upper limit temperature may be about 800° C.

In an embodiment, when the oxygen partial pressure is about 10 mTorr, the c-axis growth temperature may be about 774° C.

In an embodiment, when the oxygen partial pressure is about 200 mTorr, the c-axis growth temperature may be about 880° C.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, preferred embodiments of the inventive concept will be described in detail with reference to the accompanying drawings. However, the inventive concept is not limited to the embodiments described herein but may be embodied in other forms. Rather, the embodiments disclosed herein are provided so that this disclosure will be thorough and complete, and will fully convey the inventive concept to those skilled in the art. In addition, since in accordance with the preferred embodiments, the reference numerals shown in the order of description are not necessarily limited to the order.

In the inventive concept, a superconducting layer may typically include a superconductor. However, a superconducting layer is not limited to a superconductor. In the following embodiments, a superconductor is described as an example of a superconducting layer. In addition, examples of the superconductor may include, but are not limited to, GdBCO. That is, the superconductor may include ReBCO. ReBCO may be represented by $Re_{1+x}Ba_{2-x}Cu_3O_{7-y}$, wherein x and y satisfy, $0 \leq x \leq 0.5$ and $0 \leq y \leq 0.65$. The rare earth element (Re) may be understood as being yttrium (Y) and a lanthanide group element or a combination thereof. Examples of the lanthanide group element may include, as they are well known in the art, La, Nd, Sm, Eu, Gd, Tb, Dy, Ho, Er, Tm, Yb, Lu, and the like.

Figure 1A:
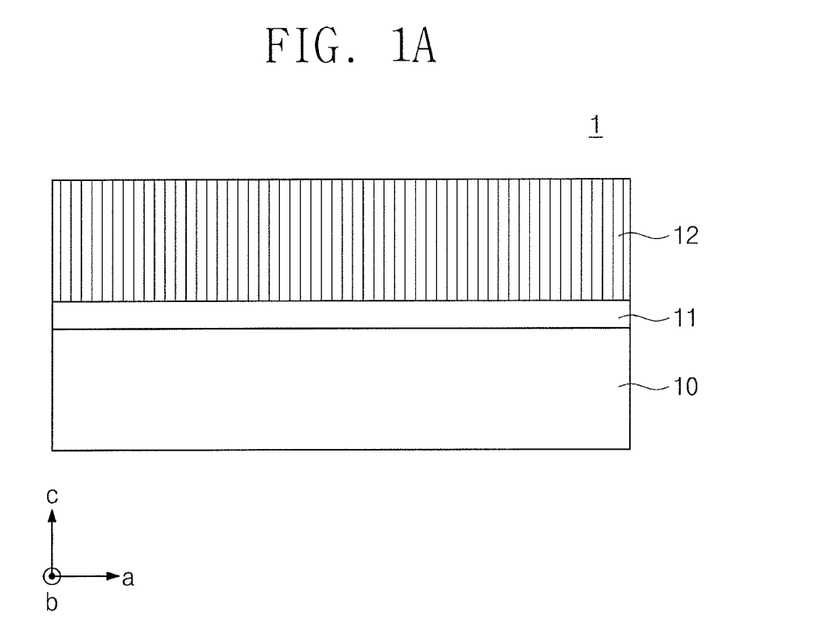
FIG. 1A is a cross-sectional view showing a superconducting wire according to the inventive concept.

FIG. 1A shows a superconducting wire 1 according to an embodiment of the inventive concept.

Referring to FIG. 1A, the superconducting wire 1 of the inventive concept may include a wire substrate 10, a buffer layer 11, and a superconducting layer 12. The superconducting substrate 10 may include a wire made of a metal (ex. iron (Fe), nickel (Ni), a nickel-based alloy (Ni—W, Ni—Cr, Ni—Cr—W, and the like), silver (Ag), a silver alloy, a cubic system metal such as a nickel-silver (Ni—Ag) composite). The buffer layer 11 may be disposed on the wire substrate 10. The buffer layer 11 may have a biaxially aligned textured structure. The buffer layer 11 may be any one of a superconducting intermediate layer, $CeO_2$, MgO, $LaAlO_3$, $LaMnO_3$, $SrTiO_3$, and the like. The buffer layer 11 serves to prevent a reaction between the wire substrate 10 and the superconducting layer 21 thereabove, and transmit crystallinity of the biaxially aligned textured structure. The superconducting layer 12 may be disposed on the buffer layer 11. For example, the superconducting layer 12 may include a metal oxide formed by using a superconducting precursor film having a mixing ratio of rare earth (ex, Gd), Ba and Cu of 1:1:2.5. The superconducting layer 12 may have critical current density higher than that of a typical superconducting layer which is a metal oxide formed by using a superconducting precursor film having a mixing ratio of rare earth, Ba and Cu of 1:2:3. For example, the superconducting layer 12 may have critical current density higher than about 300 $A/cm^2$, and a typical superconducting layer may have critical current density lower than about 100 $A/cm^2$. The superconducting layer 12 may be grown only in ac-axis direction and have biaxial alignment.

Figure 1B:
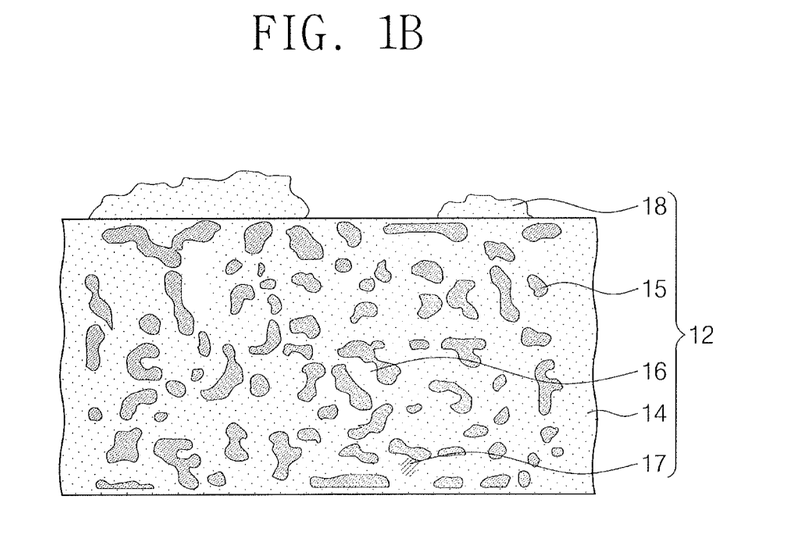
FIG. 1B is an example of the superconducting wire of FIG. 1A.

FIG. 1B shows an example of the superconducting wire 1 of FIG. 1A.

Referring to FIG. 1B, the superconducting layer 12 may include an epitaxial superconductor 14 of a rare earth-barium-copper oxide, a rare earth oxide 15, a copper oxide 16, a rare earth-copper oxide 17, and a barium-copper oxide 18. The epitaxial superconductor 14 may include stoichiometric ReBCO (ex, stoichiometric GdBCO ($Gd_1Ba_2Cu_3O_{7-y}$, $0 \leq y \leq 0.6$)) grown in the c-axis direction. The rare earth oxide 15, the copper oxide 16, the rare earth-copper oxide 17, and the barium-copper oxide 18 may be mixed and present in the epitaxial superconductor 14. For example, the rare earth oxide 15, the copper oxide 16, the rare earth-copper oxide 17, and the barium-copper oxide 18 may have a granular shape.

Figure 2:
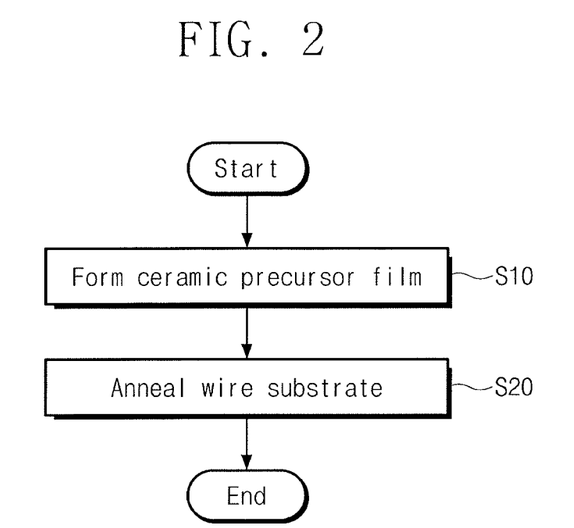
FIG. 2 is a flow chart showing a method of forming a superconducting wire of FIG. 1A.

FIG. 2 is a flow chart showing a method of forming the superconducting wire 1 of FIG. 1A.

Referring to FIG. 2, the method of forming the superconducting wire 1 of the inventive concept may include forming a superconducting precursor film (S10), and annealing the wire substrate 10 (S20). The superconducting precursor film may be formed on the buffer layer 11 (S10). The superconducting precursor film may be formed by using a method such as co-evaporation, laser ablation, CVD, metal organic deposition (MOD), or sol-gel. When the wire substrate 10 is annealed (S20), the superconducting layer 12 may have the epitaxial superconductor 14 biaxially aligned only in the c-axis direction.

Figure 3:
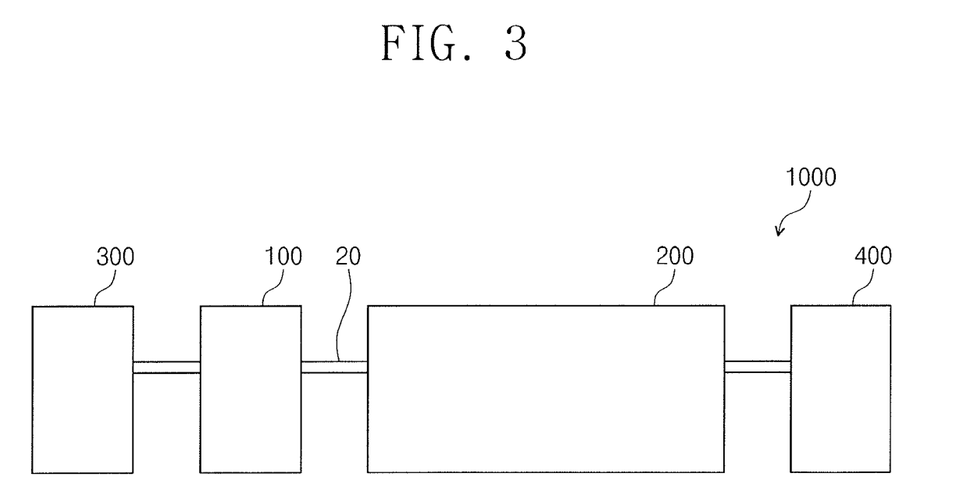
FIG. 3 is a view showing a manufacturing apparatus of a superconducting wire of FIG. 1A.

FIG. 3 shows and example of a manufacturing apparatus of the superconducting wire 1 of FIG. 1A.

Referring to FIG. 3, a manufacturing apparatus 1000 of the superconducting wire 1 may include a thin film deposition apparatus 100, an annealing apparatus 200, a substrate supply apparatus 300, and a substrate recovery apparatus 400. The thin film deposition apparatus 100, the annealing apparatus 200, the substrate supply apparatus 300, and the substrate recovery apparatus 400 may be connected in-line with vacuum pipes 20.

The thin film deposition apparatus 100 may be disposed between the substrate supply apparatus 300 and the substrate recovery apparatus 400. The thin film deposition apparatus 100 forms a superconducting precursor film on the buffer layer 11 of the wire substrate 10 S10.

Figure 4:
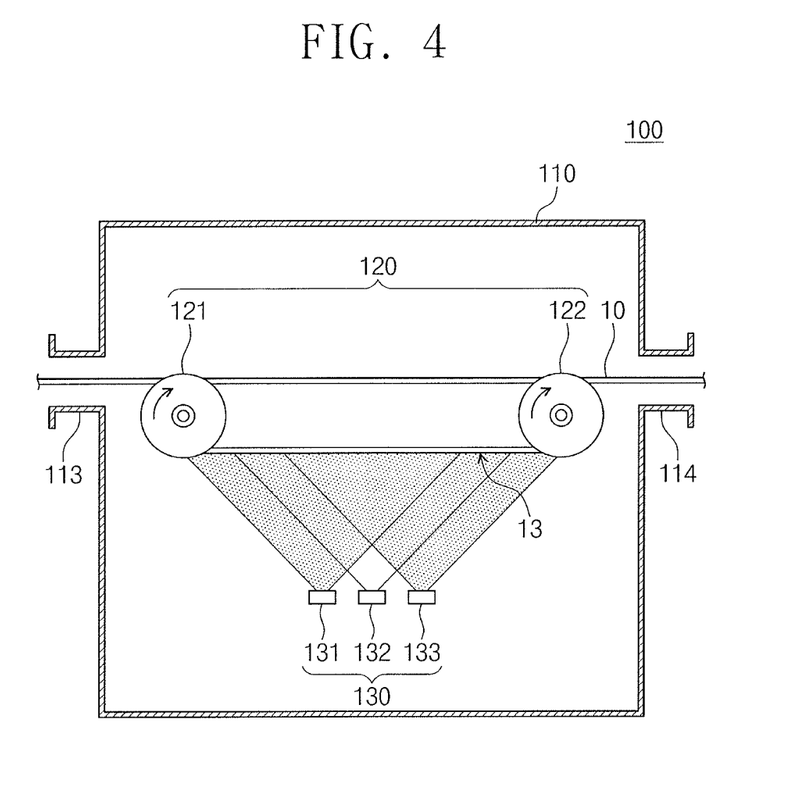
FIG. 4 and FIG. 5 are respectively a cross-sectional view and a plan view of the thin film deposition apparatus of FIG. 3.
Figure 5:
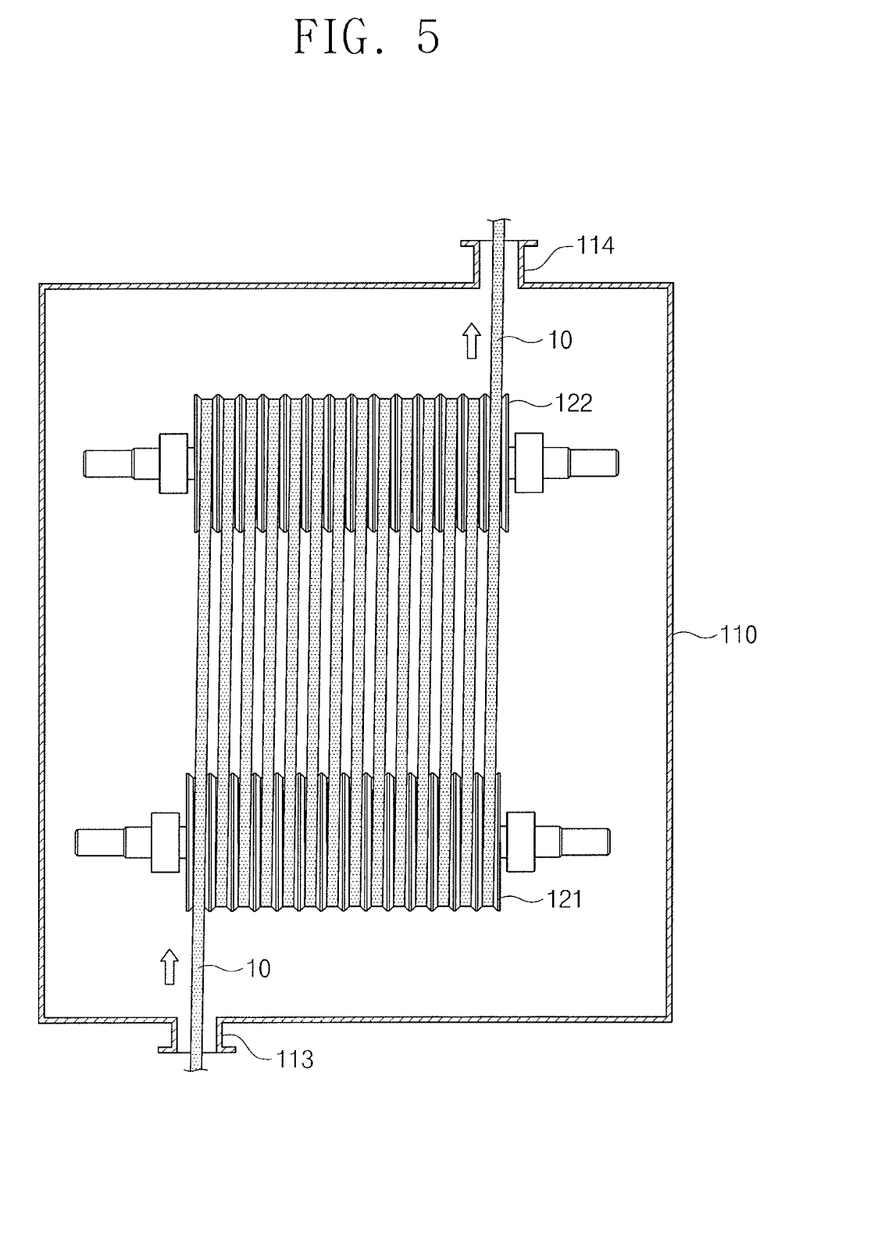

FIG. 4 and FIG. 5 are respectively a cross-sectional view and a plan view of the thin film deposition apparatus 100 of FIG. 3.

Referring to FIG. 4 and FIG. 5, the thin film deposition apparatus 100 may include an ion beam assisted deposition (IBAD) apparatus. According to one example, the thin film deposition apparatus 100 may include a process chamber 110, a reel-to-reel unit 120, and a deposition unit 130.

The process chamber 110 may provide a space in which a superconducting precursor film is formed. The process chamber 110 may have a degree of vacuum of about 1 mTorr to about 100 mTorr by pumping of a vacuum pump (not shown). In addition, the process chamber 110 may have an inlet 113 and an outlet 114 of the wire substrate 11. The inlet 113 and the outlet 114 may be connected to the vacuum pipes 20.

The reel-to-reel unit 120 may be disposed in the process chamber 110. The reel-to-reel unit 120 may perform multi-turning of the wire substrate 10. The reel-to-reel unit 120 may include a first reel member 121 and a second reel member 122.

The deposition unit 130 may be disposed under the first reel member 121 and the second reel member 122. As one example, the deposition unit 130 may deposit a superconducting precursor film on the wire substrate 10 between the first reel member 121 and the second reel member 122 by co-evaporation. The deposition unit 130 may include, below the wire substrate 10, first to third metal vapor sources 131, 132, and 133 which provide metal vapor by an electron beam. The first to third metal vapor sources 131, 132, and 133 may include a source for rare earth, a source for barium, and a source for copper, respectively. For example, the first to third metal vapor sources 131, 132, and 133 may form a superconducting precursor film on the buffer layer 11 by depositing rare earth (Re), Ba and Cu on the wire substrate 10. The superconducting precursor film may have a mixing ratio which is not stoichiometric for rare earth (Re), Ba, Cu, O bonds. According to one example, the superconducting precursor film may include Gd, Ba, and Cu having a composition in which Ba is poor (Ba<33%) and Cu is rich (Cu>50%) compared to stoichiometric GdBCO ($Gd_1Ba_2Cu_3O_{7-y}$, 0≤y≤0.6). For example, the superconducting precursor film may contain Gd, Ba, and Cu having a mixing ratio of 1:1:2.5. The mixing ratio of Gd, Ba, and Cu may be determined according to the power of the first to third metal vapor sources 131, 132, and 133.

Referring back to FIG. 2 and FIG. 3, the annealing apparatus 200 may be disposed between the thin film deposition apparatus 100 and the substrate recovery apparatus 400. The annealing apparatus 200 forms the superconducting layer 12 having the epitaxial superconductor 14 biaxially aligned only in the c-axis direction by annealing the wire substrate 10 and the superconducting precursor film (S20).

Figure 6:
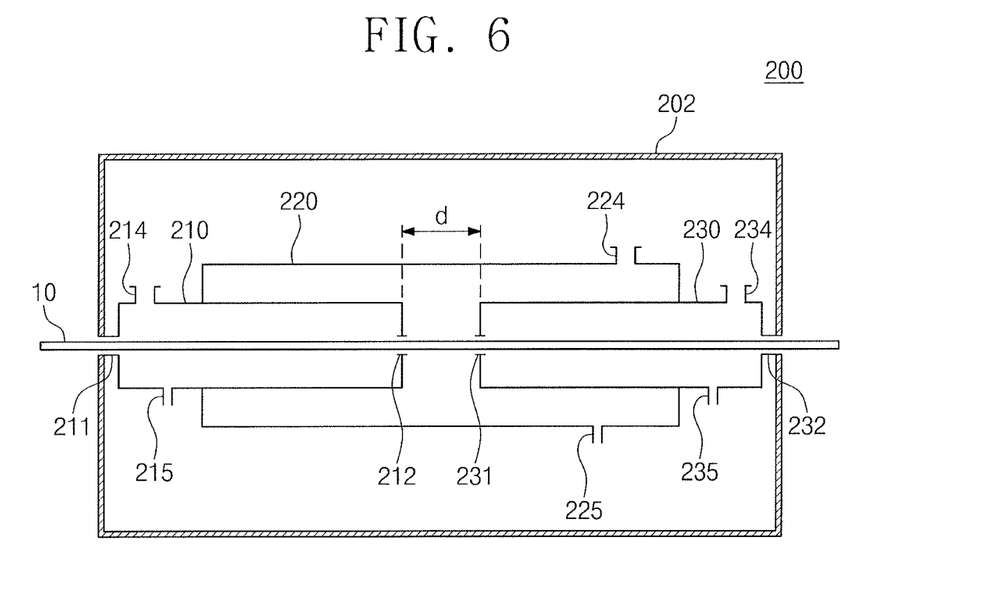
FIG. 6 is a view showing an example of the annealing apparatus of FIG. 3.

FIG. 6 shows an example of the annealing apparatus 200 of FIG. 3.

Referring to FIG. 6, the annealing apparatus 200 may include an annealing furnace 202 and first to third vessels 210, 220, and 230. The wire substrate 10 may be provided in the annealing furnace 202 and the first to third vessels 210, 220, and 230. The first vessel 210, the second vessel 220, and the third vessel 230 may be disposed in the annealing furnace 202 such that the first vessel 210, the second vessel 220, and the third vessel 230 are surrounded by the annealing furnace 202. The first vessel 210 and the third vessel 230 may be spaced apart from each other by a distance d. A central portion of the second vessel 220 may correspond to a space in which the first vessel 210 and the third vessel 230 are spaced apart from each other. The second vessel 220 is configured to surround portions of each of the first vessel 210 and the third vessel 230. The first vessel 210, the second vessel 220, and the third vessel 230 may be configured to be a cylinder-type quartz tube. The first vessel 210 may be connected to the outlet 114 of the thin film deposition apparatus 100. The first vessel 210 may have a first inlet 211 and a first outlet 212. In addition, the third vessel 230 may have a second inlet 231 and a second outlet 232. The wire substrate 10 may be drawn into the first inlet 211 of the first vessel 210, and then drawn out from the first outlet 212 thereof, may pass through the central portion of the second vessel 220 thereafter, and then may be drawn into the second inlet 231 of the third vessel 230, and then drawn out from the second outlet 232. The first vessel 210, the second vessel 220, and the third vessel 230 may maintain independent vacuum. To this end, the first vessel 210, the second vessel 220, and the third vessel 230 may have first to third pumping ports 214, 224, and 234, respectively. The first to third vessels 210, 220, and 230 may be connected to the first to third oxygen supply lines 215, 225, and 235, respectively.

Figure 7:
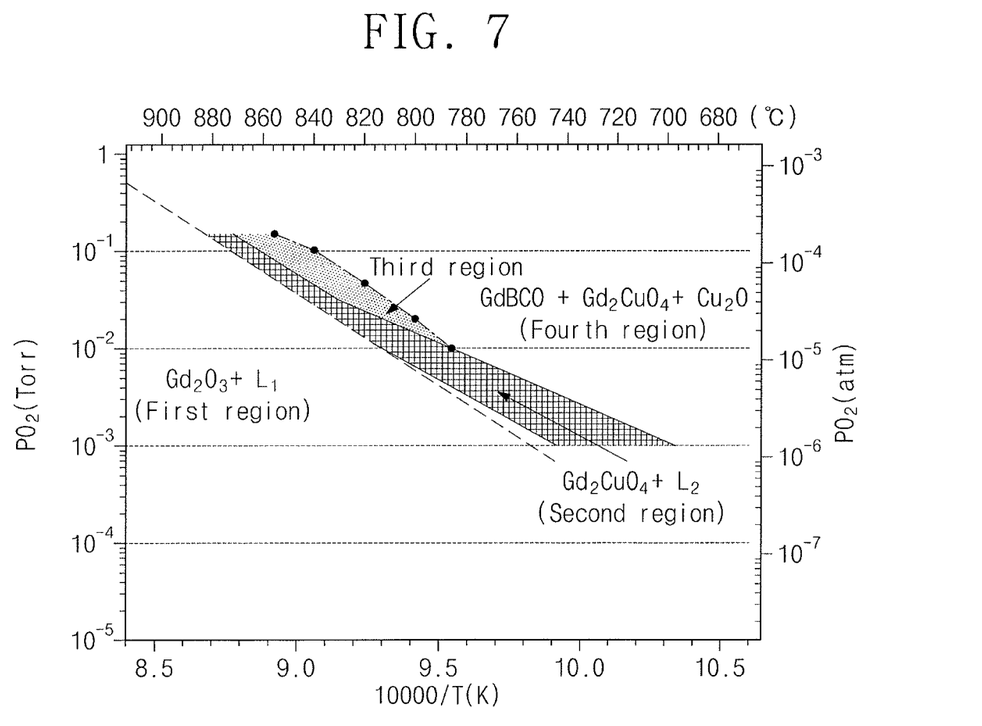
FIG. 7 is a stability phase view of stoichiometric GdBCO of a superconducting layer containing Gd:Ba:Cu in a mixing ratio of 1:1:2.5 according to a temperature and an oxygen partial pressure during an annealing process of a wire substrate.

FIG. 7 is a stability phase view of stoichiometric GdBCO ($Gd_1Ba_2Cu_3O_{7-y}$, 0≤y≤0.6) of a superconductor containing Gd:Ba:Cu in a mixing ratio of 1:1:2.5 according to a temperature and an oxygen partial pressure during an annealing process of the wire substrate 10.

Referring to FIG. 7, the superconductor may have a phase of first to fourth regions.

The first region may be a region having a solid-state gadolinium oxide ($Gd_2O_3$) and a first liquid phase $L_1$. The superconductor of the first liquid phase $L_1$ may include a gadolinium-barium-copper oxide (GdBCO), a gadolinium-copper oxide ($Gd_2CuO_4$), a barium-copper oxide ($BaCuO_2$), and a copper oxide ($Cu_2O$).

The second region may be a region having a solid-state gadolinium-copper oxide ($Gd_2CuO_4$) and a second liquid phase $L_2$. The superconductor of the second liquid phase $L_2$ may include a gadolinium-barium-copper oxide (GdBCO), a gadolinium oxide ($Gd_2O_3$), a barium-copper oxide ($BaCuO_2$), and a copper oxide ($Cu_2O$). When the first and second regions have the same temperature, the second region may have an oxygen partial pressure higher than the oxygen partial pressure of the first region. When the first and second regions have the same oxygen partial pressure, the first region may have a temperature higher than the temperature of the second region.

The third to fourth regions may be regions having a solid-state gadolinium-barium-copper oxide (GdBCO), a gadolinium oxide ($Gd_2O_3$), a gadolinium-copper oxide ($Gd_2CuO_4$), a barium-copper oxide ($BaCuO_2$), and a copper oxide ($Cu_2O$). When the superconductor or the superconducting precursor film is melted, the third region may be a region in which the epitaxial superconductor 14 grows to have biaxial alignment in the c-axis direction. That is, the superconducting precursor film is sequentially annealed through the first region, the third region, and the fourth region, and when the growth of GdBCO is achieved in the third region, the epitaxial superconductor 14 may grow to have biaxial alignment in the c-axis direction. When the first to third regions have the same temperature, the third region may have an oxygen partial pressure higher than the oxygen partial pressure of the first and second regions. When the third region and the fourth region have the same oxygen partial pressure, the third region may have a temperature higher than the temperature of the fourth region.

Figure 8:
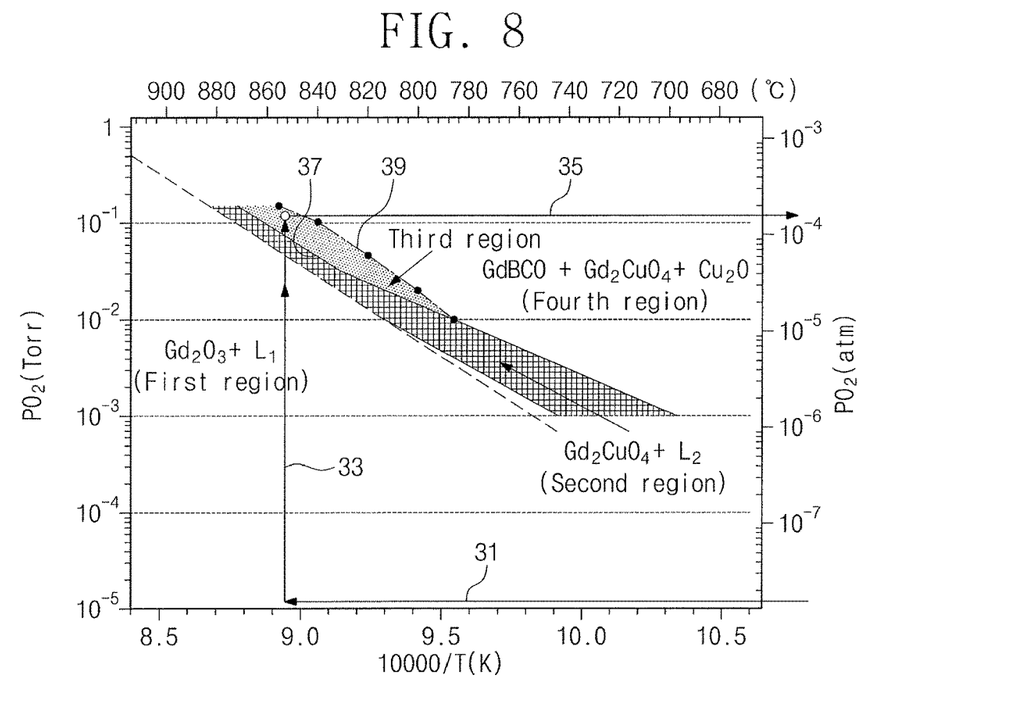
FIG. 8 is a view showing an example of an annealing method of a wire substrate.

FIG. 8 is shows an example of an annealing method of the wire substrate 10.

Referring to FIG. 8, when the superconducting precursor film is annealed along first to third paths 31, 33, and 35, the epitaxial superconductor 14 may grow in the c-axis direction. The first to third paths 31, 33, and 35 may be annealing paths for growing the epitaxial superconductor 14 in the c-axis direction by changing the temperature and oxygen partial pressure of the wire substrate 10. The first path 31 may be an annealing path for heating the wire substrate 10 to the first region. The second path 33 may be an annealing path for increasing the oxygen partial pressure from the first region to the third region. At a temperature and an oxygen partial pressure in the third region, the epitaxial superconductor 14 may grow in the c-axis direction. When the wire substrate 10 is annealed within the temperature and the oxygen partial pressure of the third region for a predetermined of time (ex, about 1 minute to about 2 minutes), the epitaxial superconductor 14 may grow to have biaxial alignment in the c-axis direction. The third path 35 may be an annealing path for cooling the wire substrate 10 from the third region to the fourth region.

Figure 9:
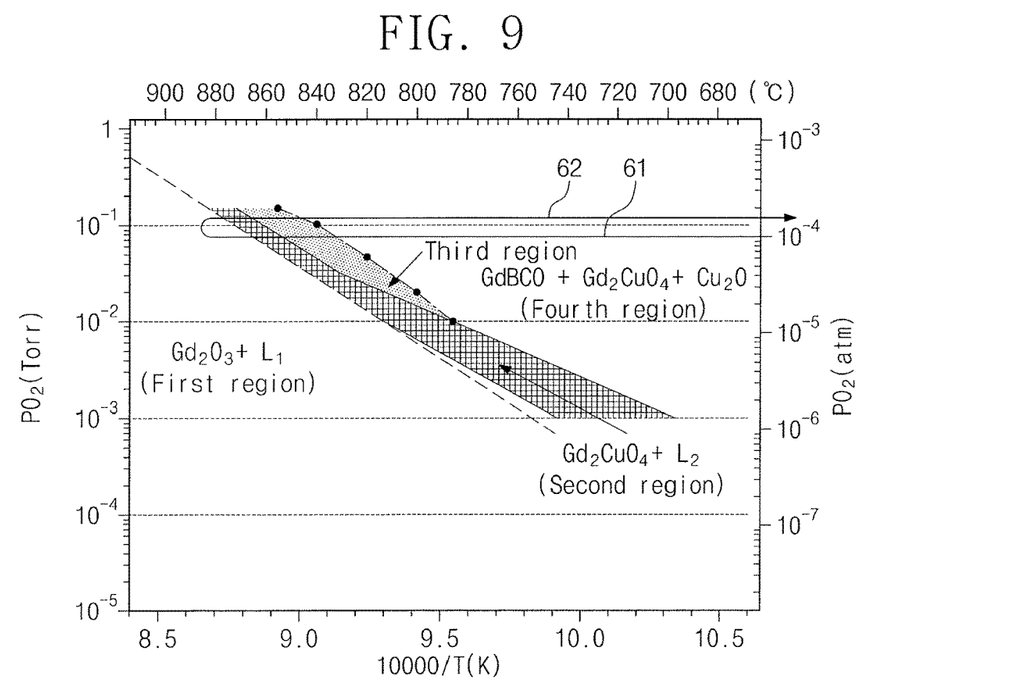
FIG. 9 is a view showing another example of an annealing method of a wire substrate.

FIG. 9 is shows another example of an annealing method of the wire substrate 10.

Referring to FIG. 9, when the superconducting precursor film is annealed along fourth to fifth paths 61 and 62, the epitaxial superconductor 14 may grow in the c-axis direction. The fourth path 61 may be an annealing path for heating the wire substrate 10 from the fourth region to the first region. The fifth path 62 may be an annealing path cooling the wire substrate 10 from the first region to the fourth region. When the wire substrate 10 is cooled along the fifth path 62, the epitaxial superconductor 14 may grow to have biaxial alignment in the c-axis direction at the temperature and the oxygen partial pressure of the third region. When the wire substrate 10 is annealed within the temperature and the oxygen partial pressure of the third region for a predetermined of time (ex, about 1 minute to about 2 minutes), the epitaxial superconductor 14 may grow to have biaxial alignment in the c-axis direction.

Figure 10:
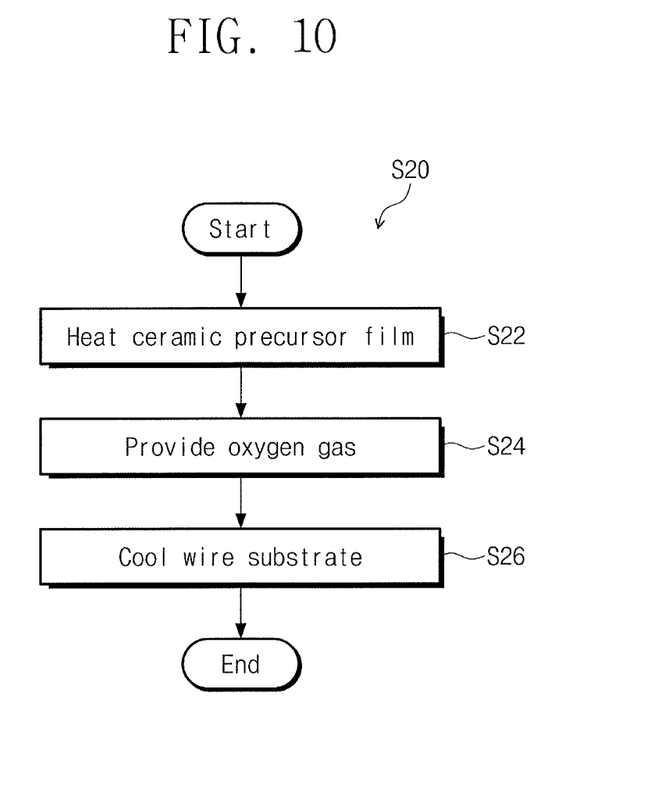
FIG. 10 is a flow chart showing an example of annealing the wire substrate 10 of FIG. 1A.

FIG. 10 is shows an example of annealing the wire substrate 10 of FIG. 1a.

Referring to FIG. 10, annealing the wire substrate 10 (S20) may include heating the substrate 10 (S22), proving an oxygen gas (S24), and cooking the wire substrate 10 (S26).

Referring to FIG. 8 and FIG. 10, the annealing furnace 202 may heat the wire substrate 10 along the first path 31 (S22). The wire substrate 10 may be continuously provided in the first to third vessels 210, 220, and 230 through the vacuum pipes 20. The vacuum pipes 20 and/or the first vessel 210 may have a first oxygen partial pressure (ex, about 1 mTorr or less). Oxygen gas may be provided in a small amount in the first vessel 210 through the first oxygen supply line 215. When the wire substrate 10 is heated along the first path 31, the oxygen gas may be diffused and/or combined in the superconducting precursor film. For example, when the wire substrate 10 is heated to about 750° C., a solid-state rare earth oxide (ex, $Gd_2O_3$) or the first liquid phase $L_1$ may be formed. A portion in which the first vessel 210 and the third vessel 230 are spaced apart from each other may be located in the vicinity of the center of the annealing furnace 202. Accordingly, the temperature in the vicinity of the center of the second vessel 220 may be maintained higher than the temperature in the first vessel 210 and the third vessel 230. The temperature in the first vessel 210 and the third vessel 230 may decrease going away from the central portion of the second container 220.

The second to third vessels 220 and 230 may provide oxygen gas provided through the second to third oxygen supply lines 225 and 235 on the superconducting precursor film along the second path 33 (S24). When the oxygen gas is provided in the second vessel 220 and the third vessel 230, a second oxygen partial pressure in the second vessel 220 and the third vessel 230 may increase along the second path 33 to a c-axis growth pressure (ex. about 20 mTorr to about 150 mTorr) which is higher than the first oxygen partial pressure. When the temperature of the wire substrate 10 is the same, the second oxygen partial pressure may increase to the third region through the second region.

When the temperature of the wire substrate 10 is the same, the third region may have the second oxygen partial pressure higher than that of the second region. When the wire substrate 10 is provided in the third region for about 1 minute to about 2 minutes (ex, 104 seconds), the superconducting layer 12 may grow to have biaxial alignment in the c-axis direction. That is, a section D of FIG. 6 may be a section in which the wire substrate 10 is annealed in the third region for about 1 minute to about 2 minutes. Meanwhile, when the wire substrate 10 is annealed in the fourth region without the c-axis growth in the third region, the superconducting layer 12 may have an a-axis growth defect or a b-axis growth defect due to the rare earth oxide 15 or the rare earth-copper oxide 17.

Figure 11:
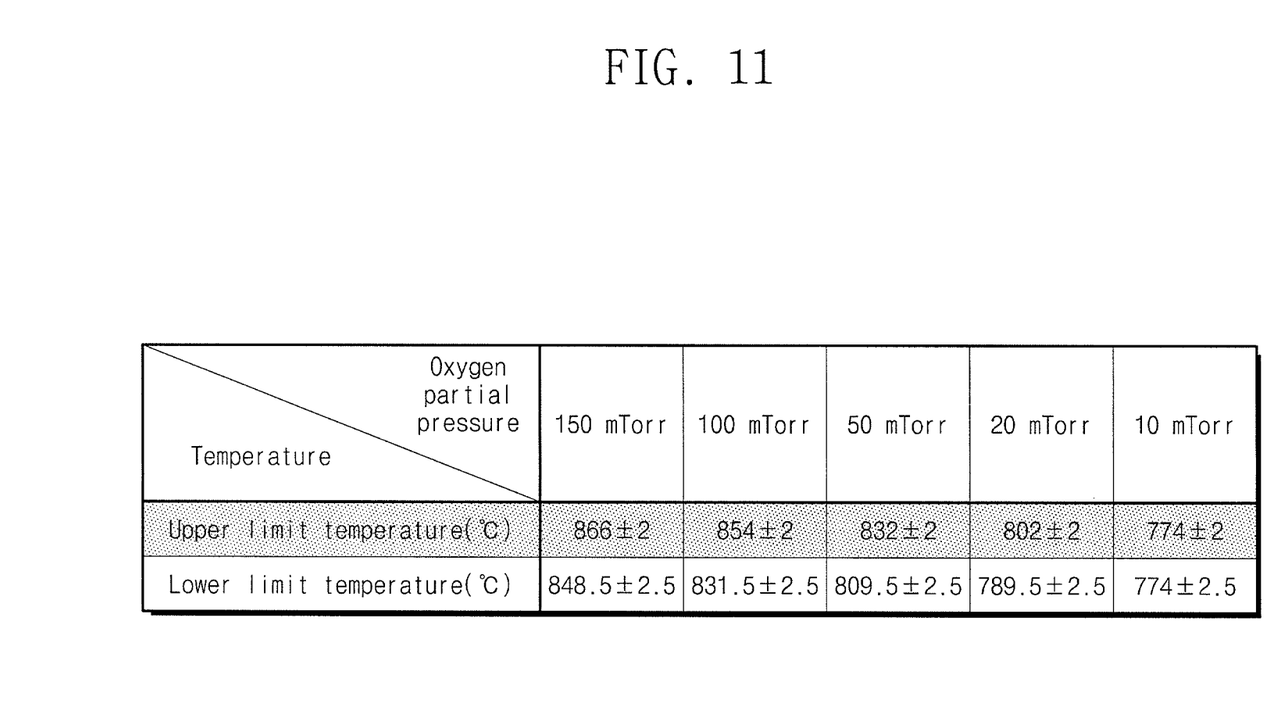
FIG. 11 is a table showing annealing temperatures and second oxygen partial pressures in the third region of FIG. 7.

FIG. 11 is shows annealing temperatures and second oxygen partial pressures in the third region of FIG. 7.

Referring to FIG. 7 to FIG. 11, the second vessel 220 and/or the third vessel 230 may provide oxygen gas of the second oxygen partial pressure selected according to a c-axis growth temperature of the wire substrate 10 on the wire substrate 10. According to one example, the third region may have a lower limit temperature and an upper limit temperature based on the second oxygen partial pressure. The c-axis growth temperature may be a temperature from the lower limit temperature to the upper limit temperature. The lower limit temperature and the second oxygen partial pressure may be determined by a lower boundary 37 of the third region. For example, when the second oxygen partial pressure increases to about 10 mTorr to about 150 mTorr, the lower limit temperature may gradually increase from about 774° C. to about 848.5° C. The upper limit temperature and the second oxygen partial pressure may be determined by an upper boundary 39 of the third region. For example, when the second oxygen partial pressure increases to about 10 mTorr to about 150 mTorr, the upper limit temperature may gradually increase from about 774° C. to about 865° C. The lower limit temperature may have an error of ±2.5° C. and the upper limit temperature may have an error of ±2° C.

Referring to FIG. 11, when the second oxygen partial pressure is about 150 mTorr, the lower limit temperature may be about 848.5° C. and the upper limit temperature may be about 866° C. When the second oxygen partial pressure is about 100 mTorr, the lower limit temperature may be about 831.5° C. and the upper limit temperature is about 854° C. When the second oxygen partial pressure is about 50 mTorr, the lower limit temperature may be about 809.5° C. and the upper limit temperature is about 832° C. When the second oxygen partial pressure is about 20 mTorr, the lower limit temperature may be about 789.5° C. and the upper limit temperature is about 802° C. When the second oxygen partial pressure is about 10 mTorr, the lower limit temperature and the upper limit temperature may be about 774° C. That is when the second oxygen partial pressure is about 10 mTorr, the c-axis growth temperature of the third region may be about 774° C. Although not illustrated, when the second oxygen partial pressure is about 200 mTorr, the c-axis growth temperature may be about 880° C. When the second oxygen partial pressure is less than about 10 mTorr or greater than about 200 mTorr, the superconducting layer 12 may have poor c-axis alignment and may have an a-axis growth defect or a b-axis growth defect.

Figure 12:
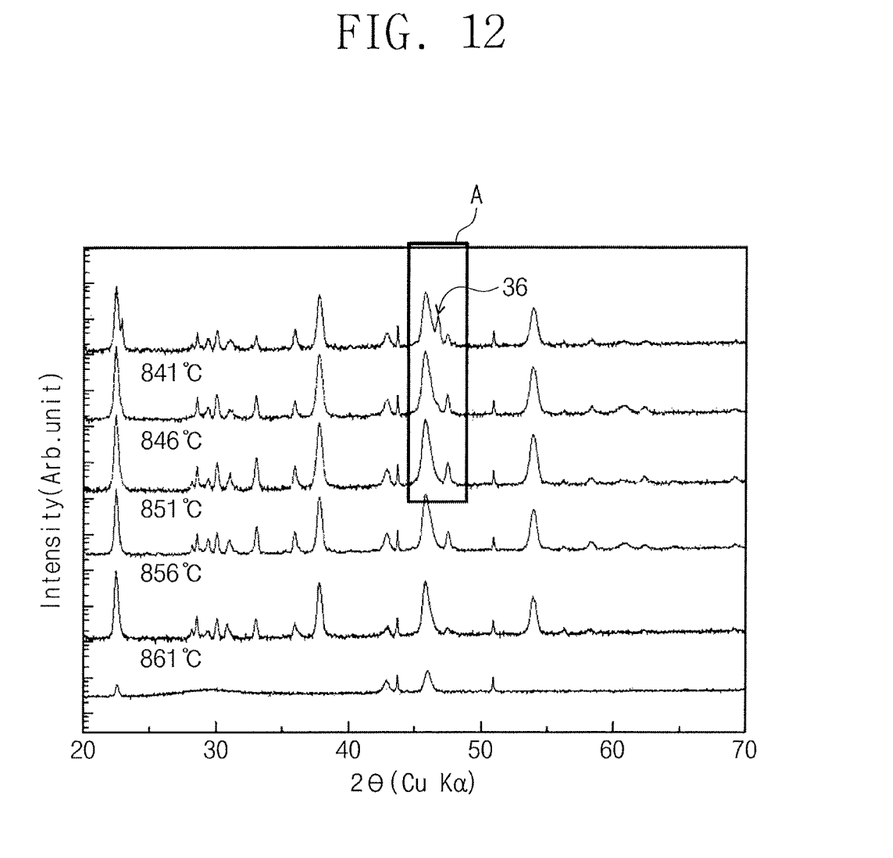
FIG. 12 is a graph showing an a-axis direction growth defect in a superconducting layer annealed in the vicinity of the third region of FIG. 7.
Figure 13:
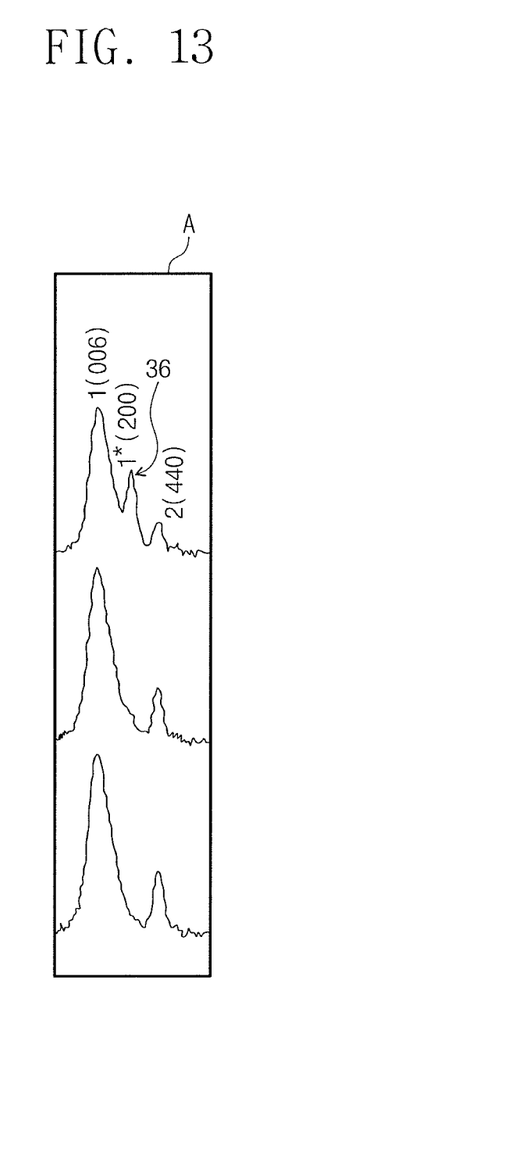
FIG. 13 is a graph showing an enlarged view of portion A of FIG. 12.

FIG. 12 shows an a-axis direction growth defect 36 in the superconducting layer 12 annealed in the vicinity of the third region of FIG. 7. FIG. 13 shows an enlarged view of portion A of FIG. 12.

Referring to FIG. 12 and FIG. 13, when the wire substrate 10 is heated to a temperature less than or equal to the lower limit temperature (ex, 841° C.) of the c-axis growth temperature at the second oxygen partial pressure of about 150 mTorr, the superconducting layer 12 may have the a-axis direction growth defect 36. The a-axis direction growth defect 36 was detected and/or measured at 2θ of a (200) surface through XRD measurement. Although not illustrated, the a-axis direction growth defect 36 may be detected and/or measured at 2θ of a (100) surface through XRD measurement.

Meanwhile, when the wire substrate 10 is heated to the c-axis growth temperature (ex, 846° C., 851° C., 856° C., and 861° C.), the epitaxial superconductor 14 may grow to have biaxial alignment in the c-axis direction. That is, an a-axis or b-axis growth does not appear. The superconducting layer 12 biaxially aligned only in the c-axis direction may have 2θ of a (600) surface or a (440) surface. Here, "only in the c-axis direction" may be supported from the absence of the (100) and (200) surfaces in the XRD graph of FIG. 12 of the epitaxial superconductor 14 grown within the c-axis growth temperature.

Referring back to FIG. 8 and FIG. 10, the wire substrate 10 may be cooled along the third path 35 in the vacuum pipe 20 or in the substrate recovery apparatus 400 outside the annealing apparatus 200 (S26). The superconducting layer 12 may be cooled in the fourth region. The fourth region may be a region in which the superconducting layer 12 of a rare earth-barium-copper oxide (ex, GdBCO), a rare earth-copper oxide (ex, Gd$_2$CuO$_4$), or a copper oxide (Cu$_2$O) is formed. For example, when the wire substrate 10 is heated to the c-axis growth temperature within a c-axis direction pressure of the third region for about 1 minute to about 2 minutes, the superconducting layer 12 may be formed of a rare-earth barium copper oxide (GdBCO) biaxially aligned only in the c-axis direction through cooling of the fourth region. Meanwhile, when the wire substrate 10 does not go through the third region, the superconducting layer 12 may have a rare earth-barium-copper oxide (GdBCO), a rare earth-copper oxide (ex, Gd$_2$CuO$_4$), or a copper oxide (Cu$_2$O) grown in an a-axis or b-axis direction.

FIG. 12 shows only an XRD graph at about 150 mTorr. However, through a similar experiment, the results as shown in FIG. 7 and FIG. 11 at about 10 mTorr to about 200 mTorr were obtained.

According to the inventive concept, a superconducting precursor film having the above-described composition may be formed as the epitaxial superconductor 14 having biaxial alignment in the c-axis direction without an a-axis or b-axis growth by annealing in the third region.

The manufacturing apparatus of a superconducting wire of FIG. 3 to FIG. 6 is merely one example for explaining the method of forming a superconducting wire according to the inventive concept. It is obvious that it is possible to form a superconductor having biaxial alignment in the c-axis direction in the third region of FIG. 7 to FIG. 9 using other manufacturing apparatuses.

A method of forming a superconducting wire according to the inventive concept is capable of forming a superconducting layer biaxially aligned only in a c-axis direction from a superconducting precursor film on a wire substrate by heating the wire substrate to a c-axis growth temperature and supplying an oxygen gas at a c-axis growth pressure.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of forming a superconducting wire, the method comprising:
   forming a superconducting precursor film on a substrate using a deposition apparatus, the superconducting precursor film containing Re, Ba, and Cu and having a composition in which Ba is poor and Cu is rich compared to stoichiometric ReBCO (Gd$_1$Ba$_2$Cu$_3$O$_{7-y}$, 0≤y≤0.65, Re: Rare earth element); and
   annealing the substrate using an annealing apparatus, such that annealing the substrate is performed for one minute to two minutes,
   wherein annealing the substrate includes:
      heating the substrate to melt the superconducting precursor film;
      providing an oxygen gas having an oxygen partial pressure of about 10 mTorr to about 200 mTorr on the molten superconducting precursor film to form a superconducting layer including an epitaxial superconductor biaxially aligned only in the c-axis direction perpendicular to the substrate; and
      cooling the substrate,
   wherein the Re is Gd, and the superconducting precursor film includes Gd, Ba, and Cu in a mixing ratio of 1:1:2.5,
   wherein the substrate is heated to a c-axis growth temperature determined according to the oxygen partial pressure, and
   wherein the c-axis growth temperature includes a lower limit temperature and an upper limit temperature, and when the oxygen partial pressure increases to about 20 mTorr to about 150 mTorr, the lower limit temperature gradually increases from about 780° C. to about 848° C., and the upper limit temperature gradually increases from about 800° C. to about 866° C.

2. The method of claim 1, wherein when the oxygen partial pressure is about 150 mTorr, the lower limit temperature is about 850° C. and the upper limit temperature is about 866° C.

3. The method of claim 1, wherein when the oxygen partial pressure is about 100 mTorr, the lower limit temperature is about 832° C. and the upper limit temperature is about 850° C.

4. The method of claim 1, wherein when the oxygen partial pressure is about 50 mTorr, the lower limit temperature is about 810° C. and the upper limit temperature is about 830° C.

5. The method of claim 1, wherein when the oxygen partial pressure is about 20 mTorr, the lower limit temperature is about 790° C. and the upper limit temperature is about 800° C.

6. The method of claim 1, wherein when the oxygen partial pressure is about 10 mTorr, the c-axis growth temperature is about 774° C.

7. The method of claim 1, wherein when the oxygen partial pressure is about 200 mTorr, the c-axis growth temperature is about 880° C.

* * * * *